United States Patent [19]

Horiuchi et al.

[11] Patent Number: 4,931,135

[45] Date of Patent: Jun. 5, 1990

[54] ETCHING METHOD AND ETECHING APPARATUS

[75] Inventors: Takao Horiuchi, Fuchu; Izumi Arai, Yokohama; Yoshifumi Tahara, Yamato, all of Japan

[73] Assignee: Tokyo Electron Limited, Tokyo, Japan

[21] Appl. No.: 287,156

[22] Filed: Dec. 21, 1988

[30] Foreign Application Priority Data

| Dec. 25, 1987 | [JP] | Japan | 62-333613 |
| Jan. 25, 1988 | [JP] | Japan | 63-14195 |
| Jan. 25, 1988 | [JP] | Japan | 63-14196 |
| Jan. 25, 1988 | [JP] | Japan | 63-14197 |
| Feb. 9, 1988 | [JP] | Japan | 63-29792 |
| Mar. 7, 1988 | [JP] | Japan | 63-53280 |

[51] Int. Cl.$^5$ .................. B44C 1/22; H01L 21/306; C23F 1/00; C03C 15/00
[52] U.S. Cl. .................. 156/643; 156/345; 156/646; 204/192.32; 204/298.35
[58] Field of Search ........ 156/345, 643, 646; 204/298 E, 192.32, 192.35, 192.37; 427/38, 39; 118/50.1, 620, 728

[56] References Cited

U.S. PATENT DOCUMENTS 4,615,755 10/1986 Tracy et al. .................. 156/345

FOREIGN PATENT DOCUMENTS

| 55-9465 | 3/1980 | Japan . |
| 55-81946 | 6/1980 | Japan . |
| 57-11954 | 3/1982 | Japan . |
| 57-156034 | 9/1982 | Japan . |
| 57-52523 | 11/1982 | Japan . |
| 58-182829 | 10/1983 | Japan . |
| 61-212023 | 9/1986 | Japan . |
| 62-105347 | 5/1987 | Japan . |
| 63-80535 | 4/1988 | Japan . |
| 63-37193 | 7/1988 | Japan . |
| 63-41986 | 8/1988 | Japan . |

Primary Examiner—William A. Powell
Attorney, Agent, or Firm—Oblin, Spivak, McClelland, Maier & Neustadt

[57] ABSTRACT

A mounting surface of an electrode for mounting an object to be processed thereon is projected to be a curved surface identical to a curved surface obtained by deforming the object to be processed by a uniform load, and etching of the object to be processed is performed. Etching of the object to be processed can be easily and stably performed, thereby improving yield and productivity.

21 Claims, 10 Drawing Sheets

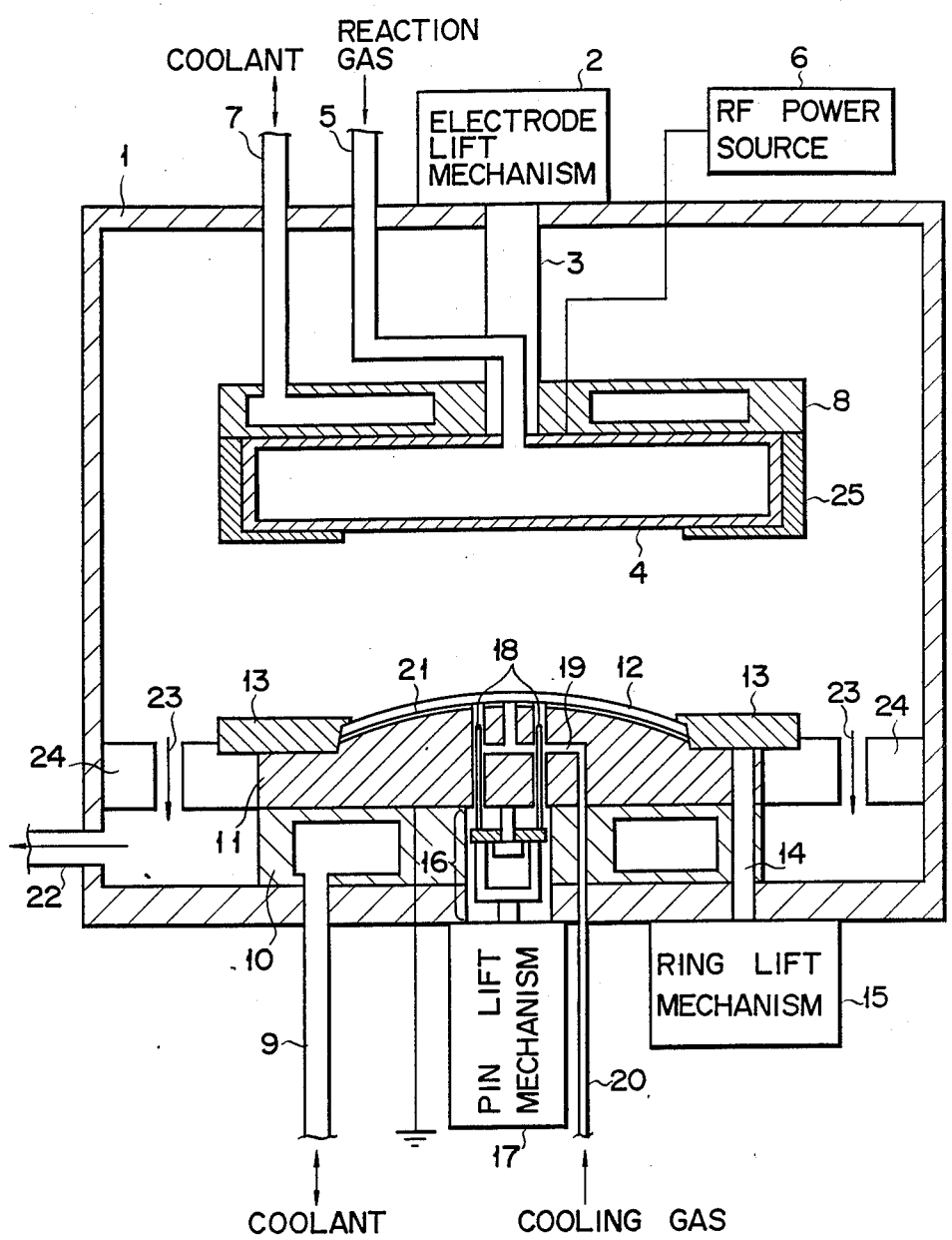
F I G. 1

ETCHING METHOD AND ETCHING APPARATUS

BACKGROUND OF THE INVENTION

1. Field of the Invention

The present invention reltes to an etching method and an etching apparatus.

2. Description of the Related Art

In the manufacture of semiconductor ICs, an etching apparatus, an ion implantation apparatus or a sputtering apparatus is conventionally used. In these apparatuses, a semiconductor wafer is fixed on a mounting table in vacuum and processing such as thin film formation or micropattern high-precision formation is performed.

In the above processing, a semiconductor wafer is heated to a high temperature and its physical characteristics change. Therefore, in order to prevent this phenomenon, Japanese Patent Disclosure (Kokai) No. 61-206225, Japanese Utility Model Publication No. 58-41722, Japanese Patent Disclosure (Kokai) No. 60-5540, Japanese Patent Publication No. 62-57066 and the like disclose techniques in which a semiconductor wafer is fixed on a projecting mounting surface of a mounting table by a forced clamp, electrostatic chucking or the like to perform cooling.

In the technique disclosed in Japanese Patent Disclosure (Kokai) No. 61-206225, however, a semiconductor wafer is electrostatically chucked on a mounting table, and a voltage is applied to both the mounting table counter electrode and the mounting table. For this reason, in bias sputtering, desired processing can be performed only when a voltage suited to the processing coincides with that required for electrostatic chucking. In sputtering or etching of another system, desired processing conditions cannot be set. In ion implantation, ion implantation amount measurement is adversely affected. Also, in a mechanism in which a semiconductor wafer is held in contact with an electrode, an electrically conductive member such as a metal must be used as a predetermined member because rigidity is necessary. Electric charges or ions in a plasma gas, however, reach the electrically conductive member around the electrodes to diffuse the plasma. For this reason, the plasma gas cannot be concentrated between the opposed electrodes. As a result, an etching rate is reduced, and etching cannot be uniformly performed.

In the technique disclosed in Japanese Utility Model Publication No. 58-41722, a semiconductor wafer cannot be held in contact with a mounting table throughout its entire surface. For this reason, since processing conditions at portions at which the semiconductor wafer is in contact with the mounting table differ from those at the other portion, processing uniformity is degraded.

In the techniques disclosed in Japanese Patent Disclosure (Kokai) No. 60-5540 and Japanese Patent Publication No. 62-57066, a layer made of a soft and thermal conductive material such as silicone rubber is formed on a projecting mounting surface of a mounting table. The silicone rubber or the like, however, generates dust to contaminate a semiconductor wafer. In addition, a gas or dust generated from inside the silicone rubber or the like reduces a vacuum degree. As a result, processing capacity is reduced to degrade a processing efficiency.

A semiconductor wafer can be reliably held by a ring-like clamp mechanism as disclosed in Japanese Patent Disclosure Nos. 61-212023, 62-105347 and 60-130633. However, if the semiconductor wafer is not clamped by a predetermined urging pressure, its entire rear surface is not uniformly brought into contact with the electrode surface. For this reason, the semiconductor wafer cannot be uniformly etched. Therefore, a peripheral portion of the semiconductor wafer is clamped toward the electrode so that substantially the entire rear surface of the semiconductor wafer is brought into contact with the electrode. In this case, if a clamp pressure is reduced lower than a predetermined pressure, the peripheral portion of the semiconductor wafer is not brought into contact with the electrode but is floated. In contrast, if the clamp pressure is increased higher than the predetermined pressure, the central portion of the semiconductor wafer is floated from the electrode. In either case, a nonetched portion is produced on the semiconductor wafer. In other words, a variation in clamp pressure poses a problem of an etching failure of the semiconductor wafer.

Japanese Patent Disclosure (Kokai) No. 59-94422 discloses a technique in which an upper electrode or a lower electrode on which a semiconductor wafer is mounted is moved vertically if necessary to perform etching of the semiconductor wafer. However, if an interval between the upper and lower electrodes is changed during etching, an etching rate may be largely changed by an electrode interval change. Therefore, an interval between the upper and lower electrodes must be set with very high precision throughout the entire surfaces of both the electrodes. Furthermore, in a structure in which upper and lower electrodes are fixed but an interval between the electrodes largely affects an etching rate of a semiconductor wafer, etching cannot be performed with high precision, high reproducibility, and high yield.

Some etching apparatuses adopt an anodized aluminum electrode capable of stably performing discharge even at a high temperature. The anodized aluminum electrode, however, is gradually consumed as aluminum chloride during etching. For this reason, the electrode has a short service life and therefore must be frequently replaced. As a result, yield of etching is poor, and an etching state must be checked by observing a semiconductor wafer after etching. Therefore, etching cannot be automatically performed.

In addition, the anodized aluminum electrode has an alumina insulating layer of a thickness of 15 to 70 $\mu$m on its surface. The alumina layer is used as a dielectric protection film. The alumina insulating layer has, however, a porous structure. For this reason, a large number of small gaps are present in a contact portion between the semiconductor wafer and the alumina insulating layer. As a result, an impedance largely varies between the semiconductor wafer and the anodized aluminum electrode. Therefore, the alumina insulating layer is easily destroyed during etching. If the alumina insulating layer is destroyed, a damage is given to the semiconductor wafer.

SUMMARY OF THE INVENTION

It is, therefore, an object of the present invention to provide an etching method capable of easily and stably performing uniform etching of an object to be processed, thereby improving yield and productivity.

It is another object of the present invention to provide an etching apparatus capable of preventing a variation in urging force of a means for urging an object to be processed against an electrode, thereby performing uniform etching of the entire surface of the object to be processed.

It is still another object of the present invention to provide an etching apparatus capable of uniformly bringing the entire surface of an object to be processed into contact with a mounting table, thereby stably and efficiently performing uniform etching.

It is still another object of the present invention to provide an etching apparatus capable of preventing abnormal discharge or the like, thereby stably performing uniform etching.

It is still another object of the present invention to provide an etching apparatus capable of prolonging a service life of an electrode to automatically and stably perform etching, thereby improving productivity.

It is still another object of the present invention to provide an etching apparatus capable of concentrating a plasma gas between opposed electrodes, thereby improving an etching rate and stably performing uniform etching.

In order to achieve the above objects, the present invention provides an etching apparatus in which an object to be processed set on one of electrodes opposed to each other at a predetermined interval in a vacuum vessel is urged against the surface of the electrode, a voltage is applied between the electrodes to convert a process gas into a plasma, and the object to be processed is etched by the plasma gas, wherein a mounting surface of the electrode on which the object to be processed is mounted has a projecting shape having a curved surface identical to a curved surface obtained by deforming the object to be processed by a uniform load.

The present invention also provides an etching method comprising the steps of:

setting in a vacuum vessel an electrode having a projecting mounting surface consisting of a curved surface identical to a curved surface deformed when an object to be processed is subjected to a uniform load;

mounting the object to be processed in contact with the mounting surface by an urging means;

arranging a counter electrode to be opposed to the electrode at a predetermined interval;

supplying a process gas in the vacuum vessel;

applying a predetermined voltage between the electrode and the counter electrode to convert the process gas into a plasma; and performing etching of the object to be processed by the process gas in a plasma state.

The present invention is directed to an etching method and an etching apparatus for performing etching of an object to be processed such as a semiconductor substrate.

The urging means preferably includes a pressure adjusting means capable of arbitrarily varying an urging pressure to be a desired pressure.

An electrically conductive member around the electrode is preferably insulated.

At least the surface of at least one electrode to be brought into contact with a plasma chlorine-based gas preferably consists of an insulating layer having an insulation resistance of 900 MΩ or more.

An impedance of a portion of an electrode holding an object to be processed is preferably uniformly set. In order to uniformly set the impedance, a synthetic polymer film may be interposed between the object to be processed and the electrode for holding it.

A heat-resistant polyimide resin is preferable as the synthetic polymer film. In addition, the polymer film is preferably adhered on the electrode by a heat-resistant acrylic resin adhesive.

An interval between the electrode and the counter electrode is preferably 0.7 to 1.5 cm at the central portions of both the electrodes.

Examples of the process gas are argon, Freon, carbon tetrachloride and boron trichloride.

BRIEF DESCRIPTION OF THE DRAWINGS

FIG. 1 is a sectional view showing an arrangement of an etching apparatus according to an embodiment of the present invention;

DETAILED DESCRIPTION OF THE PREFERRED EMBODIMENTS

Embodiment 1

Figure 2:
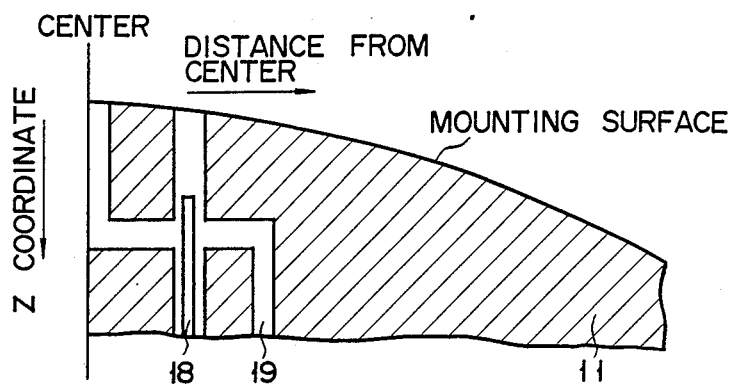
FIG. 2 is a cross sectional view illustrating the curved condition of the mounting plane of the etching apparatus.

An embodiment in which the present invention is applied to an etching apparatus used in a semiconductor manufacturing process will be described below with reference to FIG. 1.

In an upper portion of cylindrical vacuum vessel 1 made of Al and having a surface processed with anodized aluminum, electrode lift mechanism 2 consisting of an air cylinder, a ball screw and the like and upper electrode 4 which can be moved vertically through connection rod 3 are arranged. Electrode 4 consists of a plate made of Al and having a surface processed with anodized aluminum. Electrode 4 is connected to reaction gas supply pipe 5 for supplying a reaction gas such as argon, Freon, carbon tetrachloride or boron trichloride from a gas supply source (not shown). A large number of small holes (not shown) are formed in the lower surface of electrode 4 so that the reaction gas is flowed into vessel 1 through the small holes. Electrode 4 is also connected to RF power source 6 of about 13 MHz and 500 W for generating a plasma. In order to cool electrode 4 by a circulating coolant such as water, disk-like upper electrode cooling block 8 is arranged on electrode 4 and circulates a coolant supplied from a coolant circulator (not shown) through coolant pipe 7.

An alumina layer as a insulating layer having an insulation resistance of 900 MΩ or more is formed by anodized aluminum processing on the surface of electrode 4 to be brought into contact with a chlorine-based gas in a plasma state.

Similar to electrode 4, disk-like lower electrode cooling block 10 is located in a lower portion of vessel 1 and circulates a coolant such as water supplied from a coolant circulator (not shown) through coolant pipe 9. Plate-like lower electrode 11 made of Al and having a surface subjected to anodized aluminum processing is arranged to be in contact with the upper surface of block 10. Electrode 11 also serves as a semiconductor substrate mounting table and is electrically grounded.

Vessel 1 can be opened/closed by an opening/closing mechanism such as a gate valve mechanism (not shown). Semiconductor substrate 12 is conveyed in vessel 1 by a convey mechanism such as a hand arm (not shown) and mounted on lower electrode 11. Vessel 1 can be kept airtight by the opening/closing mechanism (not shown). Therefore, vessel 1 can be evacuated by a vacuum pump (not shown) to be a desired vacuum degree of several tens of m Torr to several tens of Torr. If the convey mechanism is located in an auxiliary vacuum chamber and airtightly connected to vessel 1, a time required for the vacuum pump (not shown) to evacuate vessel 1 to be a desired vacuum degree after substrate 12 is conveyed therein can be reduced.

Clamp ring 13 made of Al and having a surface subjected to anodized aluminum processing is located on an upper surface periphery of electrode 11. Ring 13 can be moved vertically by lift mechanism 15 such as an air cylinder through connection rod 14 so that a peripheral portion of substrate 12 is urged against electrode 11. Ring 13, rod 14 and lift mechanism 15 are members of clamp mechanism 50 for clamping an object to be processed such as substrate 12 between opposed upper and lower electrodes 4 and 11.

Figure 12:
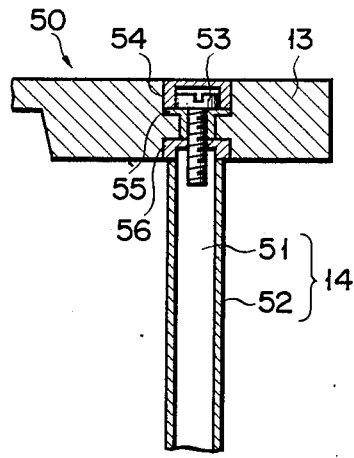
FIG. 12 is a sectional view showing a clamp mechanism of the etching apparatus shown in FIG. 1.

As shown in FIG. 12, in clamp mechanism 50, clamp ring 13 made of Al and having a surface subjected to anodized aluminum processing so that an insulating alumina coating is formed on the surface is connected by SUS screw 53 to connection rod 14 obtained by coating the surface of columnar SUS rod 51 by insulating ethylene tetrafluoride resin cylinder 52. Screw 53 is also coated by insulating members 54 to 56 made of an insulating ethylene tetrafluoride resin. That is, all the electrically conductive members, e.g., metals such as Al and SUS are insulated.

Figure 13:
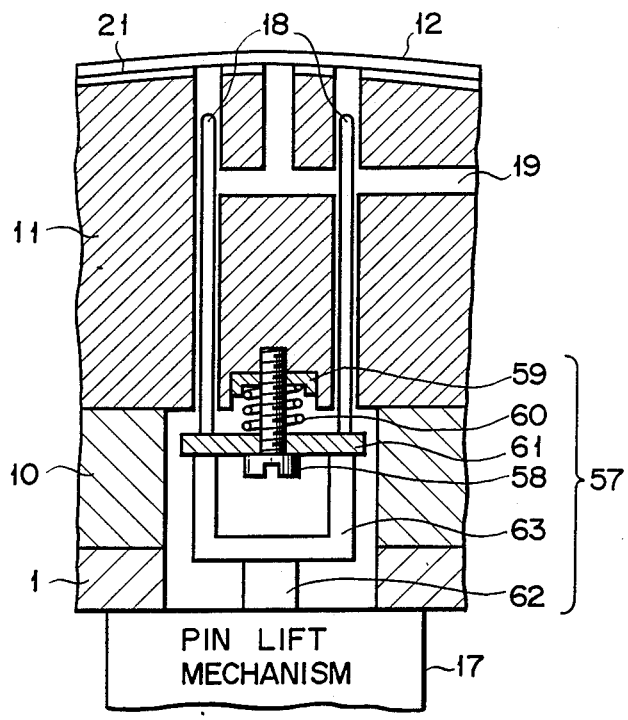
FIG. 13 is a sectional view showing a mechanism for vertically moving a semiconductor substrate with respect to a lower electrode.

At the central portion in electrode 11, three SUS lift pins 18 are connected to pin lift mechanism 17 such as an air cylinder through connection portion 57 so that substrate 12 is moved vertically with respect to electrode 11. Pins 18, connection portion 57 and lift mechanism 17 are arranged as shown in FIG. 13. That is, SUS plate 61 having lift pins 18 screwed therein together with SUS spring 60 fixed on the lower surface of electrode 11 by polyimide resin screw 58 through ethylene tetrafluoride resin insulating member 59 can reliably transmit a lifting motion of pin lift mechanism 17 through SUS rod 62 and U-shaped ethylene tetrafluoride resin insulating member 63. Electrically conductive members, e.g., metals of pins 18, spring 60 and rod 62 are not electrically connected but floated from each other.

Pins 18 are inserted in electrode 11 through part of hole 19 formed therein. Hole 19 is connected to cooling gas supply pipe 20 to supply a cooling gas such as helium gas to the bottom surface of substrate 12.

Sheet-like synthetic polymer film 21 is located between electrode 11 and a semiconductor substrate 12 mounting surface to uniform an impedance between substrate 12 and electrode 11 for holding it. Film 21 is formed of, e.g., a heat-resistant polyimide resin having a thickness of about 20 to 100 μm and adhered on the mounting surface of electrode 11 by a heat-resistant acrylic resin adhesive.

Exhaust ring 24 made of, e.g., an insulating ethylene tetrafluoride resin and having a large number of exhaust holes 23 is located between the circumferential surface of electrode 11 and vessel 1 to exhaust a reaction gas to exhaust pipe 22 formed in a side wall of vessel 1.

Shield ring 25 made of, e.g., an insulating ethylene tetrafluoride resin is formed on the circumferential surface of upper electrode 4 to generate a plasma of a size substantially the same as substrate 12 held on lower electrode 11.

Electrode 11 also serves as a mounting table for substrate 12. The projecting substrate 12 mounting surface has the same curved surface as a deformed curved surface of substrate 12 obtained when a clamp load is applied as a uniform load on the periphery of substrate 12 by clamp ring 13 upon fixing of substrate 12.

The etching apparatus having the above arrangement is operated and set by a control unit (not shown).

A method of etching semiconductor substrate 12 performed by the above etching apparatus will be described below.

Vessel 1 is opened by the opening/closing mechanism (not shown), and substrate 12 is conveyed by the convey mechanism (not shown) onto lift pins 18 moved upward by pin lift mechanism 17 and connection portion 16. Thereafter, pins 18 are moved downward to place substrate 12 on lower electrode 11, and clamp ring 13 moved upward by ring lift mechanism 15 and connection rod 14 are moved downward, thereby urging substrate 12 against electrode 11.

The surface of electrode 11 also serving as the substrate 12 mounting table is a curved surface identical to a curved surface obtained by deforming substrate 12 by a uniform load. Therefore, if a clamp load of about 2 to 3 kg is applied on the periphery of substrate 12 by ring 13 to forcively displace the periphery by about 0.7 to 0.8 mm so that substrate 12 is urged against the mounting surface of electrode 11, a contact pressure with respect to the mounting surface is uniformed throughout the entire surface of substrate 12. Therefore, a noncontact portion is not generated, and the entire surface of substrate 12 is brought into contact with the mounting surface.

Figure 3:
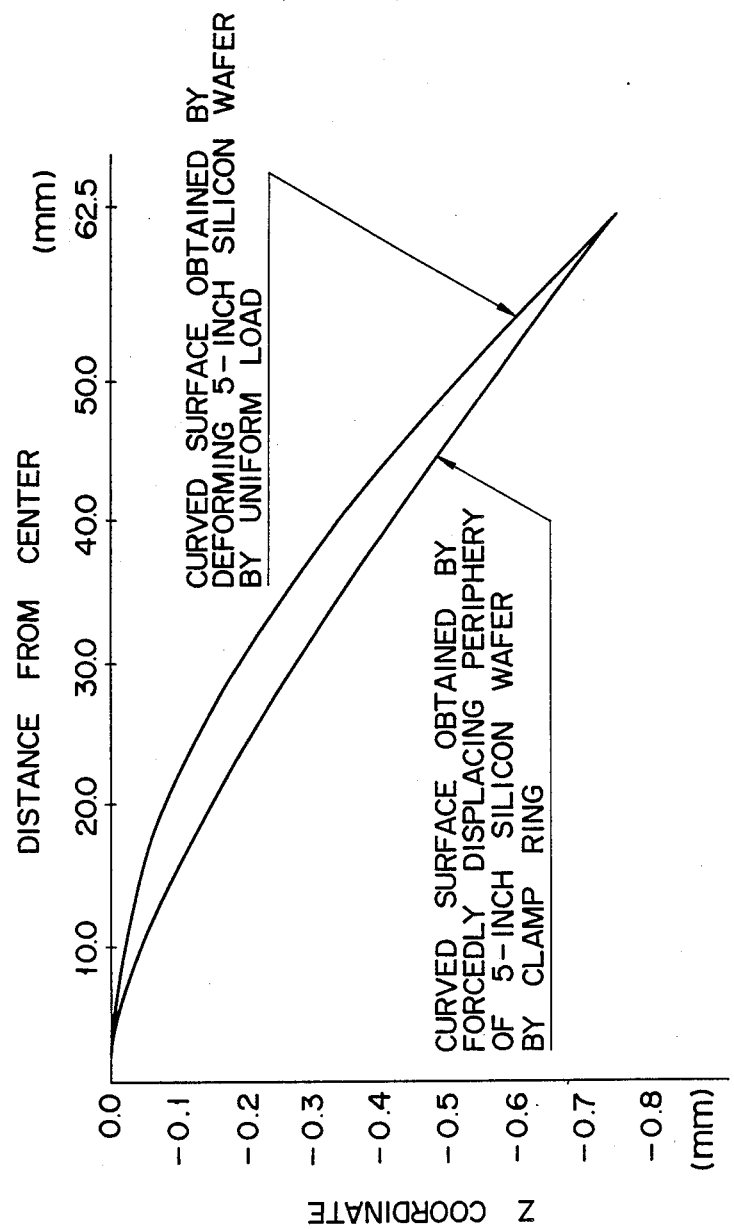
FIG. 3 is a graph for explaining the curved surface shown in FIG. 2 in terms of a Z coordinate as a function of a distance from the center of a mounting table.

Assume that substrate 12 is a silicon wafer having a thickness of 0.625 mm and a diameter of 5". Also, assume that a forced displacement amount of the periphery of the silicon wafer caused by clamp ring 13 is 0.75 mm and a clamp load of ring 13 is 2.6 kg. The Z coordinate with respect to a distance from the center of the silicon wafer mounting surface shown in FIG. 2 is set as shown in FIG. 3 so that the mounting surface of electrode 11 is projected to be a curved surface identical to a curved surface obtained by deforming substrate 12 by a uniform load when film 21 between electrode 11 and substrate 12 is removed.

Figure 4:
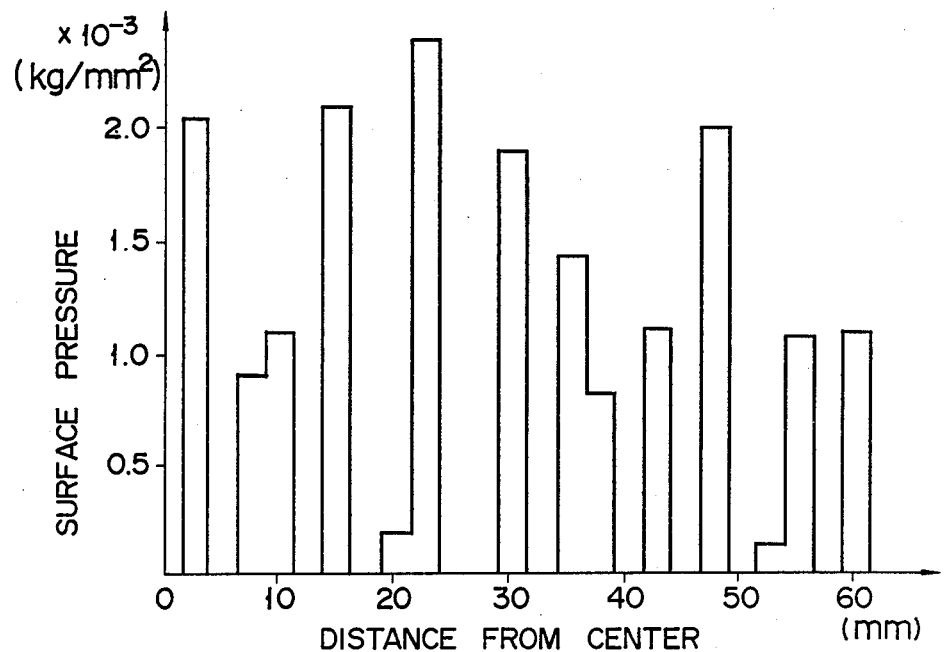
FIG. 4 is a graph showing a surface pressure distribution of a semiconductor substrate and the mounting surface obtained when no sheet-like synthetic polymer film is formed on the mounting surface shown in FIG. 2.

In this case, as shown in FIG. 4, a surface pressure between the silicon wafer and electrode 11 obtained by ring 13 is constantly high with respect to the distance from the center of the silicon wafer mounting surface, i.e., a contact pressure is uniformed.

Figure 5:
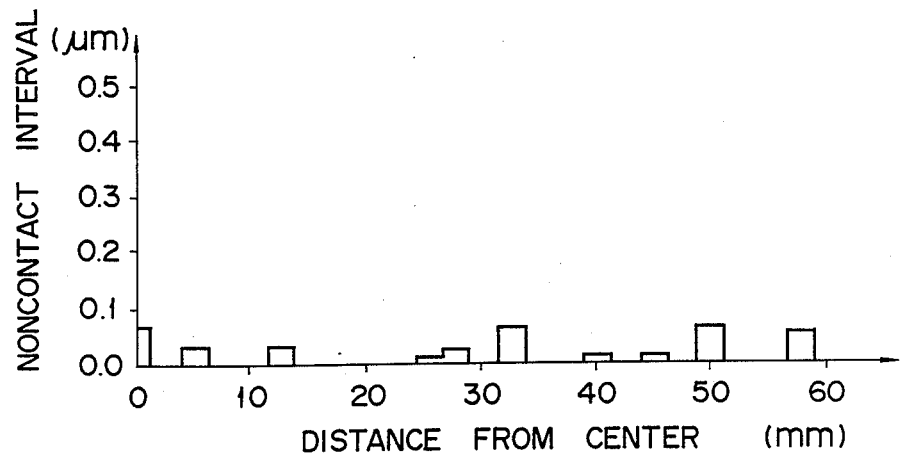
FIG. 5 is a graph showing a distribution of a noncontact interval between the semiconductor substrate and the mounting surface in the case of FIG. 4.

In addition, as shown in FIG. 5, a noncontact interval between electrode 11 and the silicon wafer is constantly small with respect to the distance from the center of the silicon wafer mounting surface, thereby preventing a noncontact portion.

Figure 6:
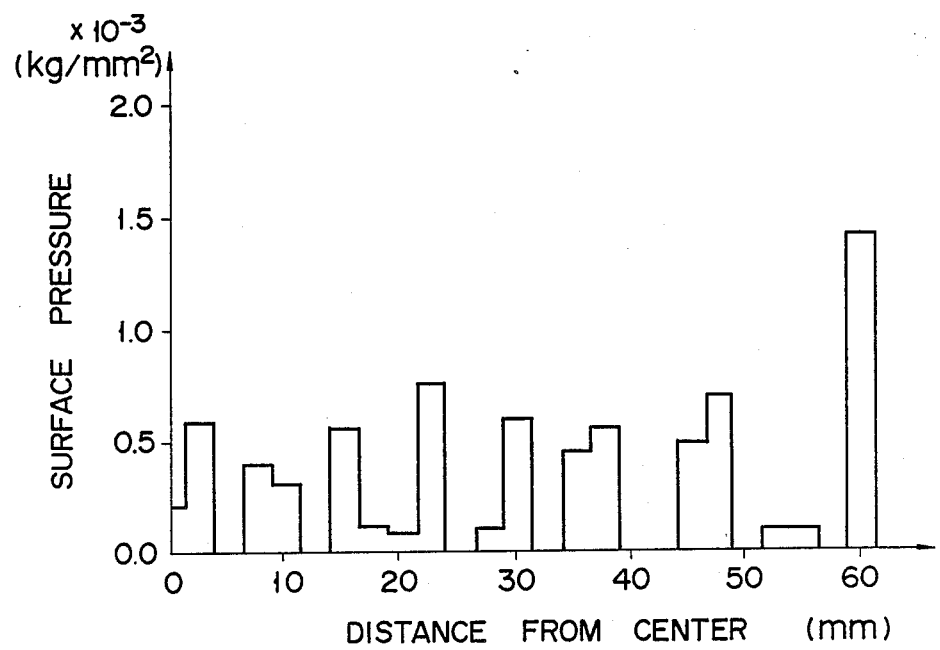
FIG. 6 is a graph showing a surface pressure distribution of the semiconductor substrate and the mounting surface obtained when a sheet-like synthetic polymer film is formed on the mounting surface shown in FIG. 2.
Figure 7:
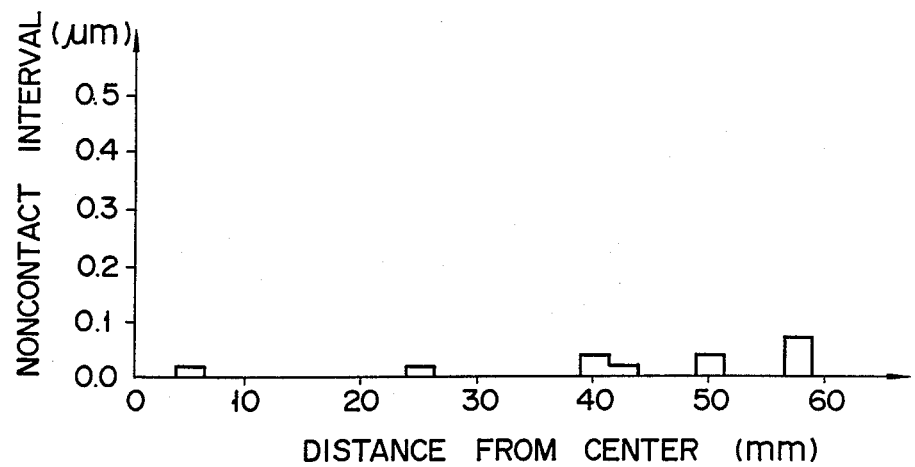
FIG. 7 is a graph showing a distribution of a noncontact interval between the semiconductor substrate and the mounting surface in the case of FIG. 6.

Under the same conditions as described above, sheet-like synthetic polymer film 21 is formed between electrode 11 and the substrate 12 mounting surface while ring 13 applies a clamp load of 2.4 kg. In this case, as shown in FIG. 6, the surface pressure between the silicon wafer and electrode 11 is constant as in FIG. 4, and the contact pressure is uniformed. In addition, as shown in FIG. 7, the noncontact interval between electrode 11 and the silicon wafer is constantly small as in FIG. 5, thereby preventing a noncontact portion.

That is, the curved surface formed on the substrate 12 mounting surface of electrode 11 is identical to the curved surface obtained by deforming substrate 12 by the uniform load. The curvature of the curved surface is smaller than that of substrate 12 deformed by applying the clamp load on its periphery by ring 13.

An ideal contact state is obtained when substrate 12 is deformed. For this reason, the contact pressure with respect to the mounting surface is uniformed throughout the entire surface of substrate 12, thereby preventing a noncontact portion. Therefore, while desired conditions of processing or measurement to be performed for substrate 12 are kept unchanged, substrate 12 can be brought into tight contact with mounting table/lower electrode 11 and uniformly cooled. In addition, since substrate 12 is urged against electrode 11 at a uniform pressure throughout its entire surface, a noncontact portion is prevented from being generated, thereby improving uniformity of the processing. Also, a layer of a soft heat conductive material such as silicone rubber need not be formed on the mounting surface. Therefore, generation of dust is prevented to realize desired vacuum processing under a clean condition, thereby improving a processing efficiency.

In this manner, substrate 12 can be mounted and cooled throughout its entire surface without adversely affecting the processing or the like, thereby improving the uniformity and stably performing processing with high efficiency.

If substrate 12 has an orientation flat portion, a difference between a distance from the center of substrate 12 to its periphery and a distance from its center to the orientation flat portion must be considered. That is, a correction displacement amount with respect to the orientation flat portion is desirably determined. For example, assuming that a correction displacement amount of the periphery of a silicon wafer having a diameter of 5" caused by clamp ring 13 is 0.75 mm, a correction displacement amount of the orientation flat portion is preferably 0.65 to 0.75 mm.

It is a matter of course that similar results are obtained if the thickness or the like of substrate 12 is changed. For example, assume that the thickness of the silicon wafer having a diameter of 5" is 0.575 to 0.65 mm. In this case, according to a number of experiments conducted by the present inventors, it is found that the same effects as described above can be obtained by properly setting the clamp load of ring 13 to be about 1.9 to 3.2 kg and forming the mounting surface to be a curved surface identical to a curved surface obtained by deforming substrate 12 by a uniform load.

At this time, the opening/closing mechanism (not shown) of vessel 1 has been closed, and vessel 1 has been evacuated to a desired vacuum state by the vacuum pump (not shown).

Upper electrode 4 is moved downward by electrode lift mechanism 2 and connection rod 3 to set the electrode interval between upper and lower electrodes 4 and 11 to be 0.7 to 1.5 cm.

A reaction gas such as chlorine atom radical or argon is supplied from the gas supply source (not shown) to electrode 4 through gas supply pipe 5. The eraction gas flows into vessel 1 through a small hole (not shown) formed in the lower surface of electrode 4. At the same time, an RF voltage is applied from RF power source 6 to electrode 4, thereby generating a plasma between electrode 4 and grounded electrode 11. Substrate 12 on electrode 11 is etched by the plasma.

Figure 11:
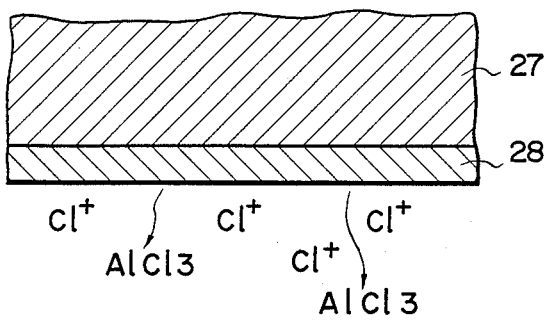
FIG. 11 is a view for explaining a function of an insulating layer of an upper electrode of the etching apparatus shown in FIG. 1.

As is microscopically shown in FIG. 11, electrode 4 has alumina layer 28 as an insulating layer having an insulation resistance of 900 MΩ or more formed on at least the surface of base aluminum layer 27 to be brought into contact with the plasma chlorine-based gas. Layer 28 has a thickness of 50 to 70 μm and an insulation resistance of 900 MΩ/500 V or more. If the insulation resistance of layer 28 is lower than 900 MΩ/500 V although the layer is apparently identical, i.e., its size, shape and thickness are identical, layer 28 on the surface is unstably etched by the chlorine atom radical in the plasma chlorine-based gas to generate aluminum chloride. As a result, the service life of layer 28 becomes unstable, e.g., the number of substrates 12 which can be processed by one layer 28 falls within a wide range of 750 to 2,250. In addition, aged electrode 4 generates abnormal discharge to cause a damage to substrate 12. Therefore, the electrode must be replaced at irregular intervals each time the life of layer 28 is terminated. In the present invention, however, the insulation resistance of layer 28 as an insulating layer is set to be 900 MΩ or more. Therefore, layer 28 is stably and slowly etched by the chlorine atom radical in the plasma chlorine-based gas to generate aluminum chloride. As a result, the service life of layer 28 is stabilized, e.g., the number of substrates 12 which can be processed by one layer 28 becomes 2,250 or more. For this reason, the stability of etching need not be constantly observed by an operator, thereby enabling an automatic operation. In addition, since the service life of electrode 4 is prolonged and stabilized, the frequency of replacement of electrode 4 is reduced. As a result, a maintenance time of the apparatus is reduced to improve the operation efficiency and productivity of the apparatus.

For example, if the insulation resistance of layer 28 of electrode 4 varies from 10 to 300 MΩ/500 V under the conditions that a vacuum degree is 0.15 Torr, RF power source electric power is 500 W, CCl$_4$+He gas flow rate is 200 cc/min, an upper electrode temperature is 20° C., a lower electrode temperature is 25° C. or less, and the thickness of layer 28 of electrode 4 is 60 μm, the number of substrates 12 which can be processed by one electrode 4 is at most 750. If the insulation resistance of layer 28 of electrode 4 is 900 MΩ/500 V, however, 2,250 or more of substrates 12 can be processed by one electrode 4. That is, if the insulation resistance of layer 28 as an insulating layer varies below 900 MΩ, the service life of layer 28 is unstably shortened regardless of its outer appearance such as a film thickness. In contrast, if the insulation resistance of layer 28 is set to be 900 MΩ or more, the service life of electrode 4 is stably prolonged. This is confirmed by a number of experiments conducted by the present inventors.

Figure 8:
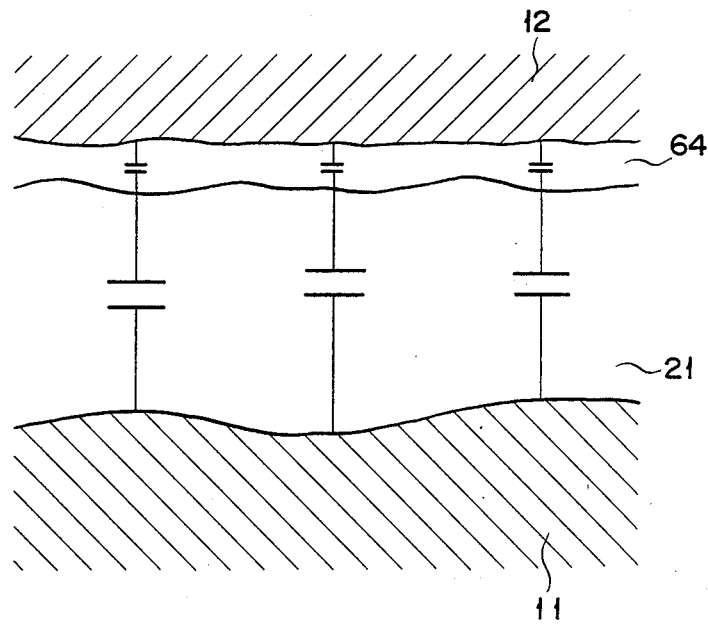
FIG. 8 is a view for explaining a function of the sheet-like synthetic polymer film used in FIG. 1.
Figure 9:
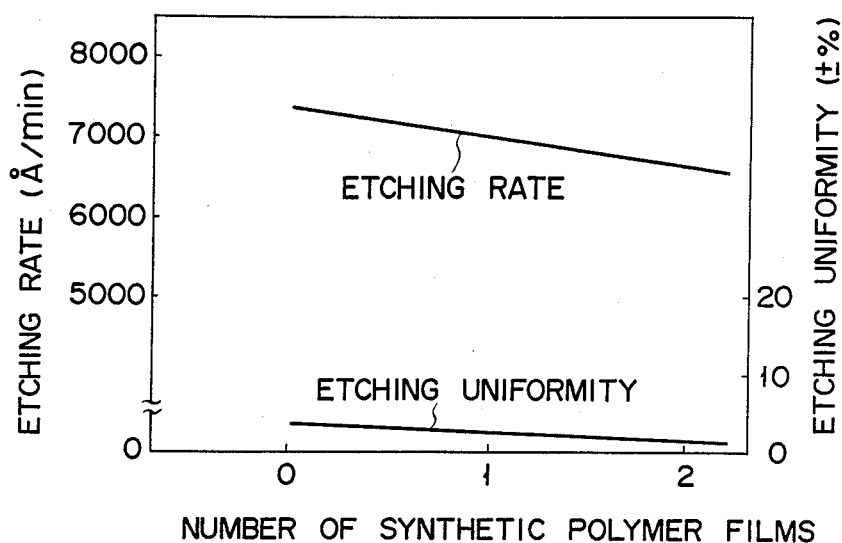
FIG. 9 is a graph showing an etching rate and etching uniformity of the etching apparatus shown in FIG. 1 as a function of the number of sheet-like synthetic polymer films.

At this time, substrate 12 is urged against electrode 11 by clamp ring 13. As is microscopically shown in FIG. 8, however, gap 64 is formed between electrode 11 and substrate 12 due to the surface roughness or the like. An impedance obtained between substrate 12 and electrode 11 by gap 64 is small but is poorly uniformed and largely varies. The anodized aluminum layer formed on the surface of electrode 11 is porous. Therefore, the uniformity of the impedance between substrate 12 and electrode 11 is further degraded. For this reason, in order to uniform the impedance between substrate 12 and electrode 11 for holding the substrate, synthetic polymer film 21 is formed between substrate 12 and electrode 11 as shown in FIG. 8. For example, a heat-resistant polyimide resin having a thickness of about 20 to 100 μm is adhered on a portion having a thickness of about 25 μm of electrode 11 by a heat-resistant acrylic resin adhesive. An impedance of film 21 between gap 64 and electrode 11 is much higher than that of gap 64. For this reason, a variation in impedance between substrate 12 and electrode 11 can be reduced, and the impedance itself can be uniformed. In addition, film 21 is not porous unlike anodized aluminum. Therefore, film 21 can contact well with substrate 12, and a variation in gap 64 can be reduced. As a result, the uniformity of gap 64 can be improved. For these reasons, the impedance between substrate 12 and electrode 11 can be uniformed. As a result, the uniformity of etching performed on substrate 12 can be improved. FIG. 9 shows an etching rate and etching uniformity as functions of the number of films 21 obtained when a 25-Ωm thick heat-resistant polyimide resin as film 21 is adhered on a 15-Ωm thick anodized aluminum insulating film of electrode 11 under the conditions that a vacuum degree is 2.4 Torr, an output from RF power source 6 is 500 W, a Freon gas flow rate is 80 cc/min, an argon gas flow rate is 500 cc/min, a temperature of electrode 4 is 20° C.; and a temperature of electrode 11 is 8° C. or less. As is apparent from FIG. 9, the etching rate sufficiently falls within a practical range, and the etching uniformity is significantly improved. Film 21 has a dense surface and is a stable material. Therefore, film 21 can prevent abnormal discharge caused by a variation in impedance of gap 64. As a result, etching can be stably performed without causing a damage to substrate 12 by abnormal discharge.

Figure 10:
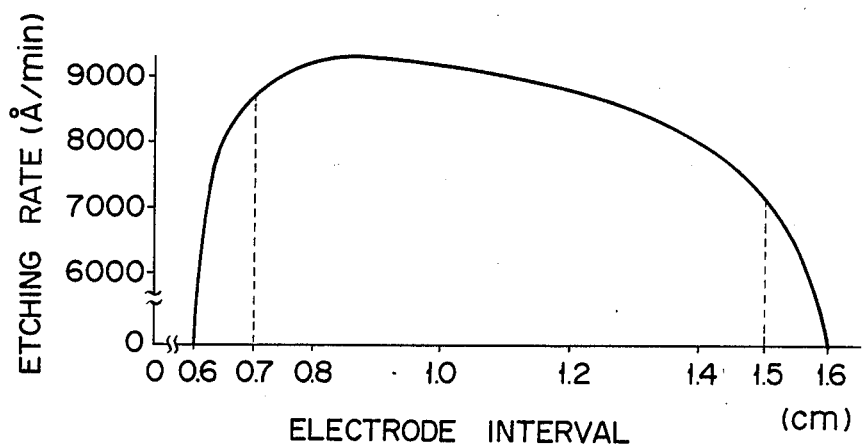
FIG. 10 is a graph showing the etching rate as a function of an electrode interval of the etching apparatus shown in FIG. 1.

The electrode interval is an interval between upper electrode 4 and the top of the projecting portion of lower electrode 11. FIG. 10 apparently shows that etching is performed when the electrode interval is 0.6 to 1.6 cm, dependency of the etching rate on an electrode interval change is low when the electrode interval is 0.7 to 1.5 cm, and the dependency of etching rate on the electrode interval change is abruptly increased and the etching rate is abruptly decreased close to 0 when the electrode interval is close to 0.6 to 1.6 cm. The present inventors have found that this relationship between the electrode interval and the etching rate substantially remains the same even if the etching conditions are changed. That is, when the electrode interval is close to 0.6 cm, a reaction gas on the etched surface of substrate 12 cannot be exhausted because the electrode interval is too narrow, and the etching rate is abruptly decreased. When the electrode interval is close to 1.6 cm, the reaction gas in a plasma state is significantly diffused because the electrode interval is too wide, and the etching rate is abruptly decreased. As is apparent from FIG. 10, when the electrode interval is set to be 0.7 to 1.5 cm so that the dependency of the etching rate change on the electrode interval change is lowered, a desired etching rate can be easily realized on the entire surface of substrate 12 without precisely adjusting the electrode interval throughout the entire surfaces of electrodes 4 and 11. As a result, since the etching uniformity is improved, the electrode interval need not be adjusted with high precision. In addition, reproducibility of etching can be improved to improve the yield and productivity.

The etching rate can be improved by cooling upper and lower electrodes 4 and 11 to a predetermined temperature by a coolant supplied from the coolant circulator (not shown) through cooling pipes 7 and 9 and upper and lower electrode cooling blocks 8 and 10, respectively. Alternatively, a cooling gas is supplied from the cooling gas supply source (not shown) to a gap between semiconductor substrate 12 and synthetic polymer film 21 through cooling gas supply pipe 20 and hole 19 at a predetermined pressure and a predetermined flow rate of, e.g., several cc/min, thereby cooling the bottom surface of substrate 12. As a result, temperature uniformity of substrate 12 can be improved to improve the etching uniformity.

By insulating shield ring 25 formed on the circumferential surface of electrode 4 and insulating clamp ring 13 formed on the periphery of electrode 11, a plasma can be generated to have substantially the same size as that of the surface to be processed of substrate 12. For this reason, plasma diffusion can be prevented to stably perform etching.

After the processing, a reaction gas is exhausted from exhaust pipe 22 through exhaust holes 23 of exhaust ring 24.

In this case, ions or electric charges in the plasma gas move to be attracted to the peripheral electrically conductive members made of metals or the like so that the plasma gas is easily diffused. As shown in FIG. 12, however, the electrically conductive members around electrodes 4 and 11, e.g., rod 51 and screw 53 as the electrically conductive members of clamp mechanism 16 for holding substrate 12 between electrodes 4 and 11 are insulated by ethylene tetrafluoride resin cylinder 52 and insulating members 54 to 56 or an alumina coating. As a result, electrode 11 serves as a ground closet to electrode 4 to which an RF voltage is applied, thereby preventing diffusion of the plasma gas from between opposed electrodes 4 and 11. As a result, since the plasma gas can be concentrated, the etching rate and uniformity can be improved and etching can be stably performed.

If the electrically conductive member of clamp mechanism 50 located near substrate 12 to be brought into contact therewith is insulated, electric charges are accumulated in the electrically conductive member to prevent discharge to substrate 12. As a result, discharge destruction of substrate 12 can be prevented.

As shown in FIG. 13, lift pins 18, spring 60, plate 61 and rod 62 as the electrically conductive members of the mechanism for moving substrate 12 vertically with respect to electrode 11 are connected through insulating polyimide screw 58 and ethylene tetrafluoride resin insulating members 59 and 63. Therefore, an electrical capacitance of the electrically conductive members can be reduced to prevent an inflow of the plasma gas. In addition, discharge destruction of substrate 12 due to electric charge accumulation of the electrically conductive members can be prevented.

In addition, exhaust ring 24 for exhausting the reaction gas after the processing is made of an insulating ethylene tetrafluoride resin. Therefore, upon exhaustion, an inflow of ions or electric charges in the plasma gas is prevented so that the plasma is not diffused but concentrated between electrodes 4 and 11.

Thereafter, vessel 1 is opened by the opening/closing mechanism (not shown), clamp ring 13 and lift pins 18 are moved upward, and substrate 12 on pins 18 is conveyed by the convey mechanism (not shown), thereby completing the operation.

In the above embodiment, the description has been made with regard to the semiconductor substrate mounting table/lower electrode of the etching apparatus. The present invention, however, can be applied to any mounting table for mounting a semiconductor substrate. For example, a semiconductor substrate may be held upside down. In addition, the present invention may be applied to a mounting table of a sputtering apparatus, an ion implantation apparatus, a CVD apparatus, or another vacuum apparatus.

In the above embodiment, the semiconductor substrate is a silicon wafer. The semiconductor substrate, however, may be a gallium arsenide wafer. That is, the present invention can be applied to a variety of semiconductor substrates.

In addition, in the above embodiment, the description has been made with regard to the mounting surface for a silicon wafer having a diameter of 5". The mounting surface is, however, not limited to that of the above embodiment but need only be projected to have a curved surface identical to a curved surface obtained by deforming a semiconductor substrate by a uniform load.

Also, in the above embodiment, the contact state between the semiconductor substrate and the mounting surface has been described with regard to two cases wherein the sheet-like synthetic polymer film is formed and not formed. The synthetic polymer film, however, may or may not be formed.

In the above embodiment, the electrode interval between the upper and lower electrodes is set to be 0.7 to 1.5 cm by vertically moving the upper electrode by the electrode lift mechanism. The electrode interval, however, may be fixed between 0.7 and 1.5 cm, the lower electrode may be moved, or both the upper and lower electrodes may be moved, as long as the electrode interval is set to be 0.7 to 1.5 cm.

In the above embodiment, an object to be processed is a semiconductor substrate. The object to be processed, however, may be an LCD (Liquid Crystal Display) substrate, a glass substrate or the like as long as it is etched.

In the above embodiment, the description has been made with regard to the surface of the upper electrode to be brought into contact with the plasma chlorine-based gas. The surface is, however, not limited to that in the above embodiment but may be that of the lower electrode or those of both the upper and lower electrodes, or may include an electrode surface not in contact with the plasma chlorine-based gas, as long as it is the surface of at least one electrode to be brought into contact with the plasma chlorine-based gas.

In the above embodiment, the alumina layer of the Al electrode subjected to anodized aluminum processing is used. An electrode material or an insulating layer material, however, is not limited to those in the above embodiment as long as the thickness of an insulating layer of the electrode surface to be brought into contact with the plasma chlorine-based gas is 900 MΩ or more.

In the above embodiment, the electrically conductive members to be insulated are those of the clamp mechanism for clamping the object to be processed between the electrodes. The electrically conductive members, however, are not limited to those in the above embodiment as long as they are electrically conductive members around the electrodes.

In the above embodiment, an ethylene tetrafluoride resin or an alumina coating is used as an insulating means. The insulating means, however, is not limited to that in the above embodiment but may be a polyimide resin as long as it can insulate the electrically conductive members around the electrodes.

Embodiment 2

Figure 15:
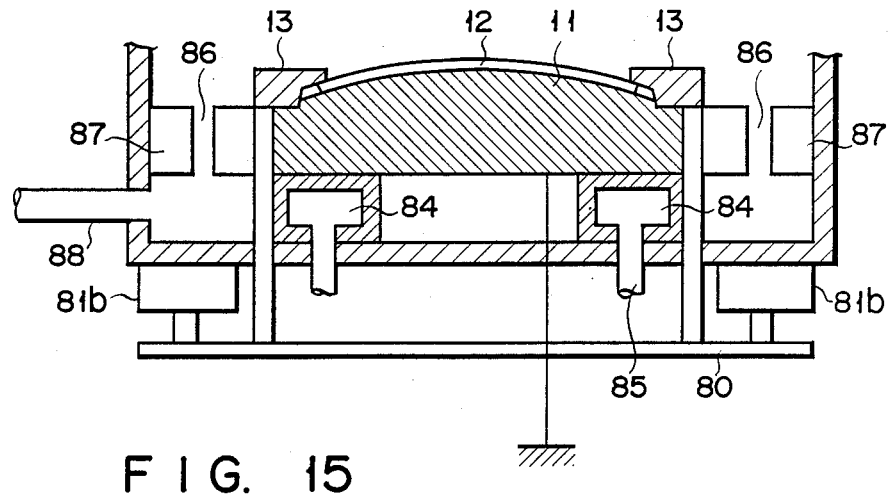
FIG. 15 is a sectional view for explaining a modification of the second embodiment in which a mounting position of an air cylinder is changed.
Figure 14:
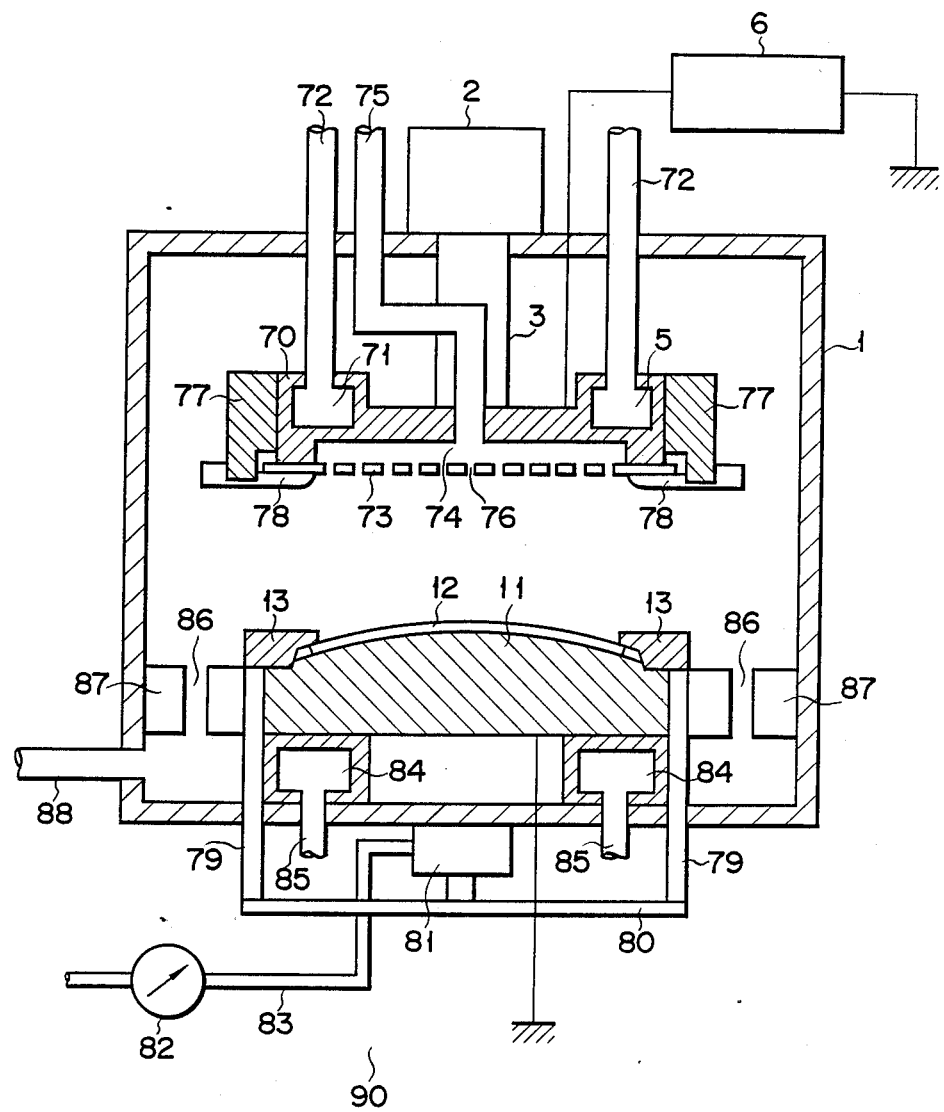
FIG. 14 is a sectional view showing an arrangement of an etching apparatus according to a second embodiment of the present invention.

Embodiment 2 in which the present invention is applied to etching of a semiconductor substrate will be described below with reference to FIGS. 14 and 15.

In an upper portion or reaction vessel 1 which is made of an electrically conductive material such as aluminum and having a surface subjected to anodized aluminum processing, and the interior of which is kept airtight, electrode body 70 is located to be moved vertically by lift mechanism 2 such as an air cylinder or a ball screw and connection rod 3. Electrode body 70 is made of an electrically conductive material such as aluminum and has a surface subjected to anodized aluminum processing. Electrode body 70 includes a cooling means. More specifically, flow path 71 is formed to circulate a coolant in electrode body 70 and is connected to the cooling means (not shown) located outside vessel 1 through pipes 72 connected thereto, thereby circulating a liquid such as water at a predetermined temperature.

Upper electrode 73 made of, e.g., amorphous carbon is electrically connected to the lower surface of electrode body 70. Small gap 74 is formed between upper electrode 73 and electrode body 70 and connected to gas supply pipe 75 for supplying a reaction gas such as argon or Freon from a gas supply source (not shown) located outside vessel 1 to gap 74. In order to flow the reaction gas supplied to gap 74 into vessel 1 through electrode 73, a plurality of holes 76 are formed in electrode 73. Insulating ring 77 is formed on the circumferential surfaces of electrode 73 and electrode body 70.

Shield ring 78 extends from the lower surface of insulating ring 77 to the periphery of the lower surface of electrode 73. Ring 78 is formed of an insulating material such as an ethylene tetrafluoride resin so as to generate a plasma of a diameter substantially the same as that of an object to be etched, e.g., semiconductor substrate 12. Substrate can be set on the surface of lower electrode 11 opposed to upper electrode 73. Electrode 11 is a plate made of, e.g., aluminum and having a surface subjected to anodized aluminum processing. The upper surface of electrode 11 is slightly inclined from its center to the periphery, i.e., the electrode is projected. An urging means such as clamp ring 13 for urging substrate 12 is arranged at the periphery of electrode 11 having the above shape. The size of ring 13 corresponds to the diameter of substrate 12 to cause the periphery of substrate 12 to abut against the surface of electrode 11. Ring 13 is made of, e.g., aluminum and having a surface subjected to anodized aluminum processing to form an insulating alumina coating thereon or made of crystal ceramic. Ring 13 is connected to a plurality of, e.g., four shafts 79 connected to ring 80 located outside vessel 1 by machine screws or the like. A lift mechanism such as an air cylinder vertically moves ring 80, thereby vertically moving ring 13. In this case, shafts 79 slide outside vessel 1. Therefore, packing or the like is used to prevent a gas leakage from vessel 1. A pressure applied by ring 13 to urge substrate 12 against electrode 11 can be set to be a predetermined pressure by pressure adjusting means 82 such as an air regulator, located midway along air supply pipe 83, for adjusting a driving pressure of cylinder 81. Adjusting means 82 may be manually adjusted or automatically adjusted, e.g., adjusted by opening/closing of a control valve in accordance with a signal supplied from a pressure sensor for monitoring an urging pressure of the cylinder. This adjustment can be performed by presetting an optimal pressure in accordance with a processing temperature of preprocessing such as diffusion or oxidation performed before plasma etching. A lifter pin (not shown) which can be vertically moved is located near the center of electrode 11 to move vertically substrate 12 upon conveyance of substrate 12. A plurality of holes (not shown) are formed in electrode 11 to flow a cooling gas such as helium gas for cooling substrate 12 therethrough. A cooling mechanism such as flow path 84 is formed in contact with the lower surface of electrode 11. A liquid cooling unit (not shown) communicating with pipe 85 connected to flow path 84 circulates a coolant such as cooling water. This cooling means and electrode 73 are not limited to a liquid cooling mechanism. For example, natural air cooling by a radiating fin, forced air cooling for cooling and circulating a gas, or electrical cooling by a Peltier effect element can be similarly performed. Exhaust ring 87 having exhaust holes 86 is fitted between a side portion of electrode 11 and the inner surface of vessel 1. A gas in vessel 1 can be exhausted by an exhaust unit (not shown) through exhaust pipe 88 connected to the side wall of vessel 1 below ring 87. Lower and upper electrodes 11 and 73 having the above arrangement are electrically connected to RF power source 89 and generate plasma discharge for etching. In this manner, etching apparatus 90 is arranged.

Figure 16:
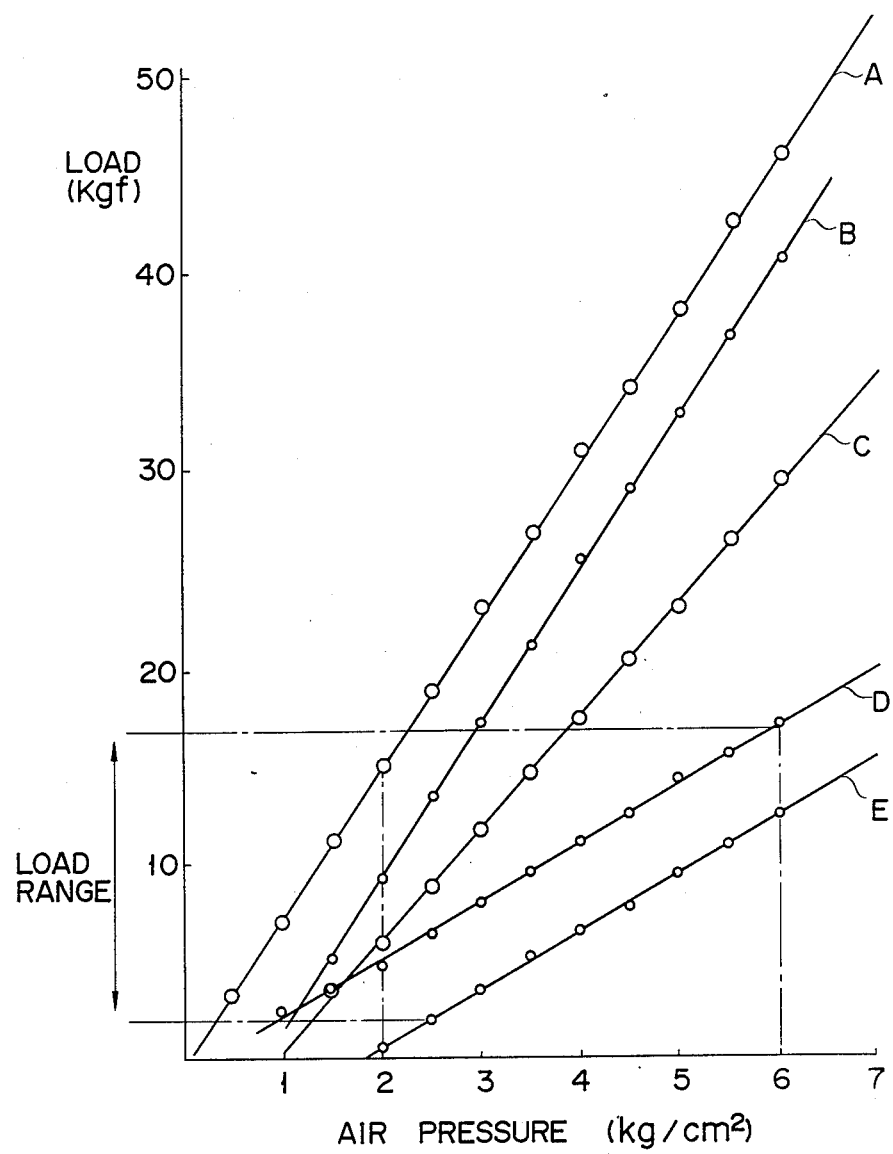
FIG. 16 is a graph for explaining characteristics of the air cylinder in the second embodiment in terms of a load as a function of an air pressure.

An operation of etching apparatus 90 will be described below. An object to be processed such as substrate 12 is conveyed from a convey portion (not shown) of vessel 1 to a portion near the center of electrode 11 while the lifter pin (not shown) which can be moved vertically through electrode 11 is moved upward. The lifter pin is then moved downward to cause substrate 12 to abut against the surface of electrode 11. Clamp ring 13 is moved downward to urge the periphery of substrate 12 toward electrode 11. This urging motion is performed by driving air cylinder 81, and an urging pressure is obtained by controlling an air pressure supplied from air supply pipe 83 to be a desired pressure by pressure adjusting means 82. If the pressure is reduced below a predetermined value, the periphery of substrate 12 is not brought into contact with electrode 11 but floated therefrom to cause an etching failure. To the contrary, if the pressure is increased over the predetermined value, the center of substrate 12 is separated from electrode 11 to also cause an etching failure. Therefore, the above desired pressure is controlled to fall within a pressure range capable of preventing the above etching failure. More specifically, in order to prevent the etching failures, the pressure, the inner diameter, and the number of cylinders 81 are arbitrarily selected so that a load for urging the periphery of substrate 12 is set to be 2 to 17 kgf for substrate 12 having a diameter of 5". The pressure of cylinder 81 is limited to an operation pressure range of installation air equipment provided to the location of etching apparatus 90, and cylinder 81 must therefore have an adjustment which can be used within this operation pressure range. That is, the arrangement is a single cylinder mechanism in which cylinder 81 is located upside down at the center of ring 80 as shown in FIG. 4 or a double cylinder mechanism in which a plurality of, e.g., two cylinders 816 are located at the periphery of ring 80 as shown in FIG. 15, and the inner diameter of cylinder 81 or 816 is selected in accordance with the mechanism. At this time, in order to suppress a downward irregular motion of cylinder 81 or 816, a coil spring (not shown) may be located between vessel 1 and ring 80. Characteristics of such a cylinder mechanism are shown in FIG. 16. In FIG. 16, reference symbol A represents the characteristic of an arrangement employing one cylinder having an inner diameter of 32 mm and no coil spring; B, that of an arrangement employing one cylinder having an inner diameter of 32 mm and a coil spring; C, that of an arrangement employing two cylinders having an inner diameter of 20 mm and a coil spring; D, that of an arrangement employing one cylinder having an inner diameter of 20 mm and no coil spring; and E, that of an arrangement employing one cylinder having an inner diameter of 20 mm and a coil spring. For example, the load range for urging the periphery of substrate 12 capable of preventing the etching failure of substrate 12 having a diameter of 5" is about 2 to 17 kgf, and the operation pressure range of an installation air equipment at the location of etching apparatus 90 is, e.g., 4 to 6 kg/cm$^2$. Therefore, as is apparent from FIG. 10, the cylinder arrangement of D or E is suitable in this case. In this manner, suitable cylinder 81 is used to urge substrate 12, and an air pressure to be supplied to cylinder 81 is adjusted to be a desired pressure by pressure adjusting means 82 such as an air regulator located midway along air supply pipe 83. This pressure may be manually adjusted or automatically adjusted, e.g., adjusted by opening/closing a control valve in accordance with a signal supplied from a pressure sensor for monitoring an urging pressure of the cylinder.

Substrate 12 is urged at a predetermined pressure by driving ring 80, shafts 79 and clamp ring 13 by selected cylinder 81. Since ring 13 is driven by a plurality of shafts 79, ring 13 sometimes does not abut against the periphery of substrate 12 at a predetermined pressure due to a mechanical error or the like. Therefore, this error is adjusted by changing the length of shaft 79. The length may be adjusted by inserting a shim such as a thin SUS plate having a thickness of 10 to 100 μm between shaft 79 and ring 80 or adjusted by a micrometer, i.e., rotating a nut-like member corresponding to a threaded portion formed in the outer surface of shaft 79. Uniformity of etching can be further improved by this height adjustment. In this manner, substrate 12 is mounted on the surface of electrode 11, the interior of vessel 1 is kept airtight, and then vessel 1 is evacuated to set a desired vacuum state. This vacuum operation may be executed beforehand by a well-known auxiliary chamber when substrate 12 is conveyed.

Electrode 70 is moved downward by lift mechanism 2 through connection rod 3 to set a desired interval, e.g., several mm between upper and lower electrodes 73 and 11. A reaction gas such as argon gas is supplied from the gas supply source (not shown) to gap 74 through gas supply pipe 75. The reaction gas supplied to gap 74 flows onto the surface of substrate 12 from a plurality of holes 76 formed in electrode 75. At the same time, RF power source 89 applies Rf power between electrodes 73 and 11 to convert the reaction gas into a plasma, and substrate 12 is etched by the plasma gas. Upon application of the RF power, the temperatures of electrodes 73 and 11 are increased to cause thermal expansion. In this case, since a thermal expansion coefficient of upper electrode 73 made of amorphous carbon differs from that of electrode body 70 made of aluminum and abutting against electrode 73, cracks may be produced. In order to prevent cracks, the cooling means (not shown) supplies cooling water to flow path 71 formed in electrode body 70 through pipe 72, thereby indirectly cooling electrode 73. If the temperature of lower electrode 11 is increased, the temperature of substrate 12 changes to adversely affect etching. Therefore, electrode 11 is also cooled by cooling water supplied from the cooling unit (not shown) to flow path 84 formed in the lower portion of electrode 11 through pipe 85. At this time, in order to process substrates 12 under constant conditions, the temperature of cooling water is controlled to be 20° to 70° C.

An exhaust gas after etching and that in the interior of vessel 1 upon conveyance of substrate 12 are exhausted by the exhaust unit (not shown) located outside vessel 1 through exhaust holes 86 formed in exhaust ring 87 and exhaust pipe 88.

In the above embodiment, clamp ring 13 connected to a plurality of shafts 79 urges substrate 12. The present invention, however, is not limited to the above embodiment. For example, a plurality of pawls may be disposed along the circumference of substrate 12 to urge substrate 12, thereby obtaining the same effects.

What is claimed is:

1. An etching apparatus in which an object to be processed set on one of electrodes opposed to each other at a predetermined interval in a vacuum vessel is urged against the surface of said electrode, a voltage is applied between said electrodes to convert a process gas into a plasma, and said object to be processed is etched by the plasma gas,
    wherein a mounting surface of said electrode on which said object to be processed is mounted has a projecting shape having a curved surface identical to a curved surface obtained by deforming said object to be processed by a uniform load.

2. An apparatus according to claim 1, wherein urging means includes pressure adjusting means for arbitrarily varying an urging force to be a desired pressure.

3. An apparatus according to claim 1, wherein an insulating layer having an insulation resistance of not less than 900 MΩ is formed on at least the surface of at least one of said electrodes to be brought into contact with the plasma gas.

4. An apparatus according to claim 1, wherein an impedance of a portion of said electrode for holding an object to be processed is uniformly set.

5. An apparatus according to claim 4, wherein means for uniforming the impedance is a synthetic polymer film formed between said object to be processed and said electrode for holding said object to be processed.

6. An apparatus according to claim 5, wherein said synthetic polymer film is a heat-resistant polyimide resin.

7. An apparatus according to claim 5, wherein said synthetic polymer film is adhered on said electrode for holding said object to be processed by a heat-resistant acrylic resin adhesive.

8. An apparatus according to claim 1, wherein an interval between the centers of said opposed electrodes is 0.7 to 1.5 cm.

9. An apparatus according to claim 1, wherein said object to be processed is a semiconductor substrate.

10. An etching method comprising the steps of:
    setting in a vacuum vessel an electrode having a projecting mounting surface consisting of a curved surface identical to a curved surface deformed when an object to be processed is subjected to a uniform load;
    mounting the object to be processed in contact with the mounting surface by urging means;
    arranging a counter electrode to be opposed to said electrode at a predetermined interval;
    supplying a process gas in said vacuum vessel;
    applying a predetermined voltage between said electrode and said counter electrode to convert the process gas into a plasma; and
    performing etching of said object to be processed by the process gas in a plasma state.

11. A method according to claim 10, wherein an impedance of a portion of said electrode for holding an object to be processed is uniformly set.

12. A method according to claim 10, wherein an interval between the centers of said electrode and said counter electrode is 0.7 to 1.5 cm.

13. A method according to claim 10, wherein the process gas is selected from the group consisting of argon, chlorofluorocarbon tetrachloride and boron trichloride.

14. A method according to claim 10, wherein said object to be processed is a semiconductor substrate.

15. An etching apparatus in which an object to be processed set on one of electrodes opposed to each other at a predetermined interval in a vacuum vessel is urged against the surface of said electrode, a voltage is applied between said electrodes to convert a process gas into a plasma, and said object to be processed is etched by the plasma gas,
    wherein a mounting surface of said electrode on which said object to be processed is mounted has a projecting shape having a curved surface identical to a curved surface obtained by deforming said object to be processed by a uniform load, wherein electrically conductive members around said electrode are insulated with coatings; and wherein the insulating coating has an insulation resistance of not less than 900 MΩ is formed on at least the surface of at least one of said electrodes to be brought into contact with the plasma gas.

16. An etching apparatus in which an object to be processed set on one of electrodes opposed to each other at a predetermined interval in a vacuum vessel is urged against the surface of said electrode, a voltage is applied between said electrodes to convert a process gas into a plasma, and said object to be processed is etched by the plasma gas, wherein a mounting surface of said electrode on which said object to be processed is mounted has a projecting shape having a curved surface identical to a curved surface obtained by deforming said object to be processed by a uniform load, and has a uniformly set impedance; and wherein electrically conductive members around said electrode are insulated with coatings.

17. An etching apparatus in which an object to be processed set on one of electrodes opposed to each other at a interval of 0.7 to 1.5 cm center to center, in a vacuum vessel is urged against the surface of said electrode, a voltage is applied between said electrodes to convert a process gas into a plasma, and said object to be processed is etched by the plasma gas, wherein a mounting surface of said electrode on which said object to be processed is mounted has a projecting shape having a curved surface identical to a curved surface obtained by deforming said object to be processed by a uniform load, and wherein electrically conductive members around said electrode are insulated with coatings.

18. An etching apparatus in which a semiconductor substrate to be processed set on one of electrodes opposed to each other at a predetermined interval in a vacuum vessel is urged against the surface of said electrode, a voltage is applied between said electrodes to convert a process gas into a plasma, and said semiconductor substrate to be processed is etched by the plasma gas, wherein a mounting surface of said electrode on which said semiconductor substrate to be processed is mounted has a projecting shape having a curved surface identical to a curved surface semiconductor substrate by deforming said object to be processed by a uniform load, and wherein electrically conductive members around said electrode are insulated with coatings.

19. An apparatus according to claim 16, wherein means for uniforming the impedance is a synthetic polymer film formed between said object to be processed and said electrode for holding said object to be processed.

20. An apparatus according to claim 19, wherein said synthetic polymer film is a heat-resistant polyimide resin.

21. An apparatus according to claim 19, wherein said synthetic polymer film is adhered on said electrode for holding said object to be processed by a heat-resistant acrylic resin adhesive.

* * * * *

UNITED STATES PATENT AND TRADEMARK OFFICE
CERTIFICATE OF CORRECTION

PATENT NO. : 4,931,135
DATED : JUNE 5, 1990
INVENTOR(S) : TAKAO HORIUCHI ET AL.

It is certified that error appears in the above-identified patent and that said Letters Patent is hereby corrected as shown below:

In the title, delete "AND ETECHING APPARATUS" and insert --AND ETCHING APPARATUS--;

In Attorney, Agent, or Firm, delete "Oblin" and insert --Oblon--.

Signed and Sealed this

Eighteenth Day of June, 1991

Attest:

HARRY F. MANBECK, JR.

*Attesting Officer*  *Commissioner of Patents and Trademarks*